United States Patent [19]
Tanabe

[11] Patent Number: 5,530,805
[45] Date of Patent: Jun. 25, 1996

[54] FAILURE ANALYSIS DEVICE FOR MEMORY DEVICES

[75] Inventor: Keiji Tanabe, Tokyo, Japan

[73] Assignee: Ando Electric Co., Ltd., Tokyo, Japan

[21] Appl. No.: 280,558

[22] Filed: Jul. 26, 1994

[30]   Foreign Application Priority Data

Jul. 28, 1993   [JP]   Japan ................... 5-205793

[51] Int. Cl.$^6$ ............................. G06F 11/00; G01R 31/26
[52] U.S. Cl. ................... 395/183.18; 395/183.13
[58] Field of Search ................ 395/183.13, 183.12, 395/183.18

[56]   References Cited

U.S. PATENT DOCUMENTS

| | | | |
|---|---|---|---|
| 4,776,025 | 10/1988 | Hosoda | 382/27 |
| 4,905,142 | 2/1990 | Matsubara et al. | 364/200 |
| 4,958,345 | 9/1990 | Fujisaki | 371/21.3 |
| 5,062,109 | 10/1991 | Ohshima et al. | 371/21.2 |
| 5,146,545 | 9/1992 | Maruyama | 395/115 |
| 5,177,692 | 1/1993 | Yano | 364/489 |
| 5,214,654 | 5/1993 | Oosawa | 371/21.1 |

*Primary Examiner*—Robert W. Beausoliel, Jr.
*Assistant Examiner*—Alan M. Fisch

*Attorney, Agent, or Firm*—Finnegan, Henderson, Farabow, Garrett & Dunner

[57]   ABSTRACT

A physical image converting circuit is used in a memory tester for or an integrated circuit tester analyzing the failure of storage devices to be measured, in which data are read as logical images from each of the corresponding storage regions to each input/output bit and are stored in each of the corresponding storage regions to each input/output bit of a failure analysis memory used for failure analysis. The physical image converting circuit converts the logical image of the readout data from the failure analysis memory into physical images so that the readout data corresponds to a physical position on a wafer chip of the failure analysis memory. The physical image converting circuit includes a counter, an address converting circuit, a failure analysis memory, and a selector. The counter generates increment addresses corresponding to at least a storage capacity of failure analysis memory. The address converting circuit generates data X and Y for specifying X and Y addresses and data P for specifying the input/output bit of the failure analysis memory based on the increment addresses. The selector selects the specified data by the data P among the readout data from the corresponding storage region of the failure analysis memory to the specified X and Y addresses by the data X and Y.

1 Claim, 6 Drawing Sheets

FIG. 2A

|    | A4 | A3 | A2 | A1 | A0 |
|----|----|----|----|----|----|
| 0  | 0  | 0  | 0  | 0  | 0  |
| 1  | 0  | 0  | 0  | 0  | 1  |
| 2  | 0  | 0  | 0  | 1  | 0  |
| 3  | 0  | 0  | 0  | 1  | 1  |
| 4  | 0  | 0  | 1  | 0  | 0  |
| 5  | 0  | 0  | 1  | 0  | 1  |
| 6  | 0  | 0  | 1  | 1  | 0  |
| 7  | 0  | 0  | 1  | 1  | 1  |
| 8  | 0  | 1  | 0  | 0  | 0  |
| 9  | 0  | 1  | 0  | 0  | 1  |
| 10 | 0  | 1  | 0  | 1  | 0  |
| 11 | 0  | 1  | 0  | 1  | 1  |
| 12 | 0  | 1  | 1  | 0  | 0  |
| 13 | 0  | 1  | 1  | 0  | 1  |
| 14 | 0  | 1  | 1  | 1  | 0  |
| 15 | 0  | 1  | 1  | 1  | 1  |
| 16 | 1  | 0  | 0  | 0  | 0  |
| 17 | 1  | 0  | 0  | 0  | 1  |
| 18 | 1  | 0  | 0  | 1  | 0  |
| 19 | 1  | 0  | 0  | 1  | 1  |
| 20 | 1  | 0  | 1  | 0  | 0  |
| 21 | 1  | 0  | 1  | 0  | 1  |
| 22 | 1  | 0  | 1  | 1  | 0  |
| 23 | 1  | 0  | 1  | 1  | 1  |
| 24 | 1  | 1  | 0  | 0  | 0  |
| 25 | 1  | 1  | 0  | 0  | 1  |
| 26 | 1  | 1  | 0  | 1  | 0  |
| 27 | 1  | 1  | 0  | 1  | 1  |
| 28 | 1  | 1  | 1  | 0  | 0  |
| 29 | 1  | 1  | 1  | 0  | 1  |
| 30 | 1  | 1  | 1  | 1  | 0  |
| 31 | 1  | 1  | 1  | 1  | 1  |

FIG. 2B

| S4 | S3 | S2 | S1 | S0 |
|----|----|----|----|----|
| 0  | 0  | 0  | 0  | 0  |
| 0  | 0  | 0  | 0  | 0  |
| 0  | 0  | 0  | 0  | 0  |
| 0  | 0  | 0  | 0  | 0  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 0  | 0  |
| 0  | 0  | 0  | 0  | 0  |
| 0  | 0  | 0  | 0  | 0  |
| 0  | 0  | 0  | 0  | 0  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 0  | 0  |
| 0  | 0  | 0  | 0  | 0  |
| 0  | 0  | 0  | 0  | 0  |
| 0  | 0  | 0  | 0  | 0  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 0  | 0  |
| 0  | 0  | 0  | 0  | 0  |
| 0  | 0  | 0  | 0  | 0  |
| 0  | 0  | 0  | 0  | 0  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |

FIG. 2C

| R4 | R3 | R2 | R1 | R0 |
|----|----|----|----|----|
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |
| 0  | 0  | 0  | 1  | 1  |

FIG. 3A

|    | N4 | N3 | N2 | N1 | N0 |
|----|----|----|----|----|----|
| 0  | 0  | 0  | 0  | 1  | 1  |
| 1  | 0  | 0  | 0  | 1  | 1  |
| 2  | 0  | 0  | 0  | 1  | 1  |
| 3  | 0  | 0  | 0  | 1  | 1  |
| 4  | 0  | 0  | 0  | 0  | 0  |
| 5  | 0  | 0  | 0  | 0  | 0  |
| 6  | 0  | 0  | 0  | 0  | 0  |
| 7  | 0  | 0  | 0  | 0  | 0  |
| 8  | 0  | 0  | 0  | 1  | 1  |
| 9  | 0  | 0  | 0  | 1  | 1  |
| 10 | 0  | 0  | 0  | 1  | 1  |
| 11 | 0  | 0  | 0  | 1  | 1  |
| 12 | 0  | 0  | 0  | 0  | 0  |
| 13 | 0  | 0  | 0  | 0  | 0  |
| 14 | 0  | 0  | 0  | 0  | 0  |
| 15 | 0  | 0  | 0  | 0  | 0  |
| 16 | 0  | 0  | 0  | 1  | 1  |
| 17 | 0  | 0  | 0  | 1  | 1  |
| 18 | 0  | 0  | 0  | 1  | 1  |
| 19 | 0  | 0  | 0  | 1  | 1  |
| 20 | 0  | 0  | 0  | 0  | 0  |
| 21 | 0  | 0  | 0  | 0  | 0  |
| 22 | 0  | 0  | 0  | 0  | 0  |
| 23 | 0  | 0  | 0  | 0  | 0  |
| 24 | 0  | 0  | 0  | 1  | 1  |
| 25 | 0  | 0  | 0  | 1  | 1  |
| 26 | 0  | 0  | 0  | 1  | 1  |
| 27 | 0  | 0  | 0  | 1  | 1  |
| 28 | 0  | 0  | 0  | 0  | 0  |
| 29 | 0  | 0  | 0  | 0  | 0  |
| 30 | 0  | 0  | 0  | 0  | 0  |
| 31 | 0  | 0  | 0  | 0  | 0  |

FIG. 3B

| (P1) D4 | (Y0) D3 | (P0) D2 | (X1) D1 | (X0) D0 |
|----|----|----|----|----|
| 0 | 0 | 0 | 1 | 1 |
| 0 | 0 | 0 | 1 | 0 |
| 0 | 0 | 0 | 0 | 1 |
| 0 | 0 | 0 | 0 | 0 |
| 0 | 0 | 1 | 0 | 0 |
| 0 | 0 | 1 | 0 | 1 |
| 0 | 0 | 1 | 1 | 0 |
| 0 | 0 | 1 | 1 | 1 |
| 0 | 1 | 0 | 1 | 1 |
| 0 | 1 | 0 | 1 | 0 |
| 0 | 1 | 0 | 0 | 1 |
| 0 | 1 | 0 | 0 | 0 |
| 0 | 1 | 1 | 0 | 0 |
| 0 | 1 | 1 | 0 | 1 |
| 0 | 1 | 1 | 1 | 0 |
| 0 | 1 | 1 | 1 | 1 |
| 1 | 0 | 0 | 1 | 1 |
| 1 | 0 | 0 | 1 | 0 |
| 1 | 0 | 0 | 0 | 1 |
| 1 | 0 | 0 | 0 | 0 |
| 1 | 0 | 1 | 0 | 0 |
| 1 | 0 | 1 | 0 | 1 |
| 1 | 0 | 1 | 1 | 0 |
| 1 | 0 | 1 | 1 | 1 |
| 1 | 1 | 0 | 1 | 1 |
| 1 | 1 | 0 | 1 | 0 |
| 1 | 1 | 0 | 0 | 1 |
| 1 | 1 | 0 | 0 | 0 |
| 1 | 1 | 1 | 0 | 0 |
| 1 | 1 | 1 | 0 | 1 |
| 1 | 1 | 1 | 1 | 0 |
| 1 | 1 | 1 | 1 | 1 |

FIG. 3C

| P | Y | X |
|---|---|---|
| 0 | 0 | 3 |
| 0 | 0 | 2 |
| 0 | 0 | 1 |
| 0 | 0 | 0 |
| 1 | 0 | 0 |
| 1 | 0 | 1 |
| 1 | 0 | 2 |
| 1 | 0 | 3 |
| 0 | 1 | 3 |
| 0 | 1 | 2 |
| 0 | 1 | 1 |
| 0 | 1 | 0 |
| 1 | 1 | 0 |
| 1 | 1 | 1 |
| 1 | 1 | 2 |
| 1 | 1 | 3 |
| 2 | 0 | 3 |
| 2 | 0 | 2 |
| 2 | 0 | 1 |
| 2 | 0 | 0 |
| 3 | 0 | 0 |
| 3 | 0 | 1 |
| 3 | 0 | 2 |
| 3 | 0 | 3 |
| 2 | 1 | 3 |
| 2 | 1 | 2 |
| 2 | 1 | 1 |
| 2 | 1 | 0 |
| 3 | 1 | 0 |
| 3 | 1 | 1 |
| 3 | 1 | 2 |
| 3 | 1 | 3 |

FIG. 9 (PRIOR ART)

| | ADDRESS OF CONVERSION MEMORY | | | | | CONVERSION OUTPUT DATA | | | | | | I/O | Y | X |
|---|---|---|---|---|---|---|---|---|---|---|---|---|---|---|
| | A4 | A3 | A2 | A1 | A0 | P1 | P0 | Y0 | X1 | X0 | | | | |
| 0 | 0 | 0 | 0 | 0 | 0 | 0 | 0 | 0 | 1 | 1 | | 0 | 0 | 3 |
| 1 | 0 | 0 | 0 | 0 | 1 | 0 | 0 | 0 | 1 | 0 | | 0 | 0 | 2 |
| 2 | 0 | 0 | 0 | 1 | 0 | 0 | 0 | 0 | 0 | 1 | | 0 | 0 | 1 |
| 3 | 0 | 0 | 0 | 1 | 1 | 0 | 0 | 0 | 0 | 0 | | 0 | 0 | 0 |
| 4 | 0 | 0 | 1 | 0 | 0 | 0 | 1 | 0 | 0 | 0 | | 1 | 0 | 0 |
| 5 | 0 | 0 | 1 | 0 | 1 | 0 | 1 | 0 | 0 | 1 | | 1 | 0 | 1 |
| 6 | 0 | 0 | 1 | 1 | 0 | 0 | 1 | 0 | 1 | 0 | | 1 | 0 | 2 |
| 7 | 0 | 0 | 1 | 1 | 1 | 0 | 1 | 0 | 1 | 1 | | 1 | 0 | 3 |
| 8 | 0 | 1 | 0 | 0 | 0 | 0 | 0 | 1 | 1 | 1 | | 0 | 1 | 3 |
| 9 | 0 | 1 | 0 | 0 | 1 | 0 | 0 | 1 | 1 | 0 | | 0 | 1 | 2 |
| 10 | 0 | 1 | 0 | 1 | 0 | 0 | 0 | 1 | 0 | 1 | | 0 | 1 | 1 |
| 11 | 0 | 1 | 0 | 1 | 1 | 0 | 0 | 1 | 0 | 0 | | 0 | 1 | 0 |
| 12 | 0 | 1 | 1 | 0 | 0 | 0 | 1 | 1 | 0 | 0 | | 1 | 1 | 0 |
| 13 | 0 | 1 | 1 | 0 | 1 | 0 | 1 | 1 | 0 | 1 | | 1 | 1 | 1 |
| 14 | 0 | 1 | 1 | 1 | 0 | 0 | 1 | 1 | 1 | 0 | | 1 | 1 | 2 |
| 15 | 0 | 1 | 1 | 1 | 1 | 0 | 1 | 1 | 1 | 1 | | 1 | 1 | 3 |
| 16 | 1 | 0 | 0 | 0 | 0 | 1 | 0 | 0 | 1 | 1 | | 2 | 0 | 3 |
| 17 | 1 | 0 | 0 | 0 | 1 | 1 | 0 | 0 | 1 | 0 | | 2 | 0 | 2 |
| 18 | 1 | 0 | 0 | 1 | 0 | 1 | 0 | 0 | 0 | 1 | | 2 | 0 | 1 |
| 19 | 1 | 0 | 0 | 1 | 1 | 1 | 0 | 0 | 0 | 0 | | 2 | 0 | 0 |
| 20 | 1 | 0 | 1 | 0 | 0 | 1 | 1 | 0 | 0 | 0 | | 3 | 0 | 0 |
| 21 | 1 | 0 | 1 | 0 | 1 | 1 | 1 | 0 | 0 | 1 | | 3 | 0 | 1 |
| 22 | 1 | 0 | 1 | 1 | 0 | 1 | 1 | 0 | 1 | 0 | | 3 | 0 | 2 |
| 23 | 1 | 0 | 1 | 1 | 1 | 1 | 1 | 0 | 1 | 1 | | 3 | 0 | 3 |
| 24 | 1 | 1 | 0 | 0 | 0 | 1 | 0 | 1 | 1 | 1 | | 2 | 1 | 3 |
| 25 | 1 | 1 | 0 | 0 | 1 | 1 | 0 | 1 | 1 | 0 | | 2 | 1 | 2 |
| 26 | 1 | 1 | 0 | 1 | 0 | 1 | 0 | 1 | 0 | 1 | | 2 | 1 | 1 |
| 27 | 1 | 1 | 0 | 1 | 1 | 1 | 0 | 1 | 0 | 0 | | 2 | 1 | 0 |
| 28 | 1 | 1 | 1 | 0 | 0 | 1 | 1 | 1 | 0 | 0 | | 3 | 1 | 0 |
| 29 | 1 | 1 | 1 | 0 | 1 | 1 | 1 | 1 | 0 | 1 | | 3 | 1 | 1 |
| 30 | 1 | 1 | 1 | 1 | 0 | 1 | 1 | 1 | 1 | 0 | | 3 | 1 | 2 |
| 31 | 1 | 1 | 1 | 1 | 1 | 1 | 1 | 1 | 1 | 1 | | 3 | 1 | 3 |

FAILURE ANALYSIS DEVICE FOR MEMORY DEVICES

BACKGROUND OF THE INVENTION

1. Field of the Invention

The present invention relates to physical image converting circuits, and more particularly, to physical image converting circuits used in a memory tester or an integrated circuit tester for analyzing the failure of storage devices to be measured. The data are read as the logical image from each of the corresponding storage regions to each input/output bit (I/O bit) of the storage device and are stored in each of the corresponding storage regions to each I/O bit of a memory used for failure analysis. The physical image converting circuit rapidly converts the logical image of data from the memory into a physical image so that the data corresponds to a physical position on a wafer chip of the memory.

2. Background Art

In the case of analyzing the failure of a storage device, data are read from each memory cell of the storage device to be measured and are stored as "logical images" in the corresponding storage region to addresses of a plurality of memories used for failure analysis (hereafter referred to as failure analysis memories). The plurality of the failure analysis memories is mounted on a plurality of printed circuit boards in a memory tester or an integrated circuit tester. The "logical image" will be explained with reference to FIG. 4. In FIG. 4, each failure analysis memory 7A through 7D has a storage capacity which corresponds to X addresses having a value of 0 through 3, and to Y addresses having a value of 0 or 1. The failure analysis memories 7A through 7D form a failure analysis memory 7. Each of the failure analysis memories 7A through 7D correspond to each of input/output bit data (I/O bit data) read from I/O pins 0 through 3 of the failure analysis memory 7. Therefore, when one of the combinations of X and Y addresses is supplied to the failure analysis memory 7, each 1-bit of data is read from each of the failure analysis memories 7A through 7D and thereby 4-bit data is delivered from the I/O pins 0 through 3 of the failure analysis memory 7. In FIG. 4, each fall F is stored in the corresponding storage regions of the failure analysis memories 7A and 7B to the combination of the X address 0 and the Y address 1 and of the failure analysis memories 7C and 7D to the combination of the X address 0 and the Y address 0. Accordingly, in this specification, as shown in FIG. 4, the term "logical image" visually represents the storage state where the data are the corresponding storage region to the combination of the X and Y addresses of every I/O bit in the failure analysis memory 7.

FIG. 5 shows the actual, i.e. physical, alignment of the failure analysis memories 7A through 7D in the wafer chip and the actual, i.e. physical, position on the wafer chip of the fails F stored in the failure analysis memories 7A through 7D. In FIG. 5, it can be seen that the four fails F are stored in adjacent memory cells at the center area of the failure analysis memory 7, namely, that the adjacent memory cells at each adjacent corner in the failure analysis memories 7A through 7D are defective. Therefore, the term "physical image" indicates a visual representation of the physical storage state of the data on the wafer chip of the failure analysis memory 7, into which the data of the logical image are converted so that the position of the fail F can be seen on the actual wafer chip of the failure analysis memory 7. It is indispensable for the failure analysis to convert the logical image into a physical image.

It is conventionally known to read out the data represented by the logical image from each of the failure analysis memories 7A through 7D and to convert the logical image into a physical image using software or a RAM.

An example of the structure of a conventional physical image converting circuit using a RAM will be explained with reference to FIG. 6. In FIG. 6, a counter 1, a failure analysis memory 7, a selector 8, a CPU 9, and a conversion memory 10, are provided. In FIG. 6, the conversion memory 10 is made up of a RAM and conversion output data are pre-stored in the corresponding storage region to each address therein. The conversion output data X0, X1, Y0, P0 and P1 corresponding to addresses represented by bit data A0 through A4 supplied from the counter 1 are read out from the conversion memory 10. The failure analysis memory 7 is made up of a plurality of failure analysis memories 7A through 7D. I/O bit data I/O0 through I/O3 corresponding to the bit data X0, X1, and Y0 among the conversion output data supplied from the conversion memory 10 are read out from the failure analysis memory 7. The selector 8 selects any one of I/O bit data I/O0 through I/O3 supplied from the failure analysis memory 7 based on the data P0 and P1 from the conversion memory 10 and supplies the selected data to the CPU 9. Accordingly, the data stored as the logical image in the failure analysis memory 7 are sequentially expanded and are converted into the physical image.

Next, the operation of the physical image converting circuit shown in FIG. 6 will be explained with reference to FIGS. 7 through 9. FIG. 7 shows the physical alignment of memory cells in the failure analysis memory 7 in the case where the failure analysis memory 7 shown in FIG. 4 is made up of four failure analysis memories 7A through 7D. In FIG. 7, the I/O bit data I/O0 are stored in the upper left part of the failure analysis memory 7, the I/O bit data I/O1 are stored in the upper right part thereof, the I/O bit data I/O2 are stored in the lower left part thereof and the I/O bit data I/O3 are stored in the lower right part thereof. In FIG. 7, the order of X addresses are reversed to the logical image in each of the storage regions of the I/O bit data I/O0 and I/O2. FIG. 8 shows the numbered memory cells of the failure analysis memory 7 in the case of the physical alignment of the memory cells shown in FIG. 7. In FIG. 8, there are thirty-two memory cells in the failure analysis memory 7 and the data are read out from the memory cells as a physical image from 1 to 32 in numerical order.

FIG. 9 shows an example of the data stored in the conversion memory 10. In FIG. 9, the addresses consist of the bit data A0 through A4 of 5 bits and conversion output data are stored in the corresponding storage region to each address of the conversion memory 10. In FIG. 9, as an example of the conversion output data, 2-bits data (P0, P1) for determining any I/O bit data among the I/O bit data I/O0 through I/O3 in the selector 8, 1-bit data Y0 indicating the Y address 0 or 1 of each of the memory cell of the failure analysis memory 7, and 2-bit data (X0, X1) indicating the X addresses 0 through 3 of each of the memory cell of the failure analysis memory 7, are shown. When the bit data (P0, P1) is "00", the selection of the I/O bit data I/O0 is instructed to the selector 8. When the data (P0, P1) is "01", the selection of the I/O bit data I/O1 is instructed to the selector 8. When the data (P0, P1) is "10", the selection of the I/O bit data I/O2 is instructed to the selector 8. In addition, when the data (P0, P1) is "11", the selection of the I/O bit data I/O3 is instructed to the selector 8.

For example, when "00000" is supplied as an address to the conversion memory 10, "00" is delivered as the bit data (P0, P1), "0" is delivered as the bit data Y0, that is, "0" is delivered as the Y address, and "11" is delivered as the bit data (X0, X1), that is, "3" is delivered as the X address from the conversion memory 10.

As explained above, by storing the conversion output data in the corresponding storage region in each address of the conversion memory 10 and supplying the count value generated in the counter 1 as the address to the conversion memory 10, the data can be read out from each memory cell of the failure analysis memory 7 as the physical image, from 1 to 32, in numerical order as shown in FIG. 8.

Recently, since the storage capacity of the memory devices tends to be large and the cell construction of the memory devices tends to be complex, the acceleration of the failure analysis function is demanded for a memory tester or an integrated circuit tester.

However, in the case of the conversion of a logical image into a physical image using software, a very long execution time is needed.

In the case of the conversion of the logical image into the physical image using a RAM, since time for storing the conversion output data in the conversion memory 10 is needed, the larger storage capacity of the memory devices, the larger storage capacity of the conversion memory 10. In addition, in the case of increasing readout speed for reading out the conversion output data from the conversion memory 10, since high-speed access of the conversion memory 10 is necessary, the high cost of the physical image converting circuit is a drawback.

SUMMARY OF THE INVENTION

In consideration of the above problems, it is an object of the present invention to provide a physical image converting circuit which is able to convert logical images into physical images of failure analysis memory using hardware without a conversion memory.

To satisfy this object, the present invention provides a physical image converting circuit in which data are read as logical images from each of the corresponding storage regions to each input/output bit and are stored in each of the corresponding storage regions to each input/output bit of a failure analysis memory used for failure analysis, for converting the logical images of the readout data from the failure analysis memory into physical images so that the readout data corresponds to a physical position on a wafer chip of the failure analysis memory, the physical image converting circuit comprising: a counter for generating increment addresses corresponding to at least the storage capacity of the memory; an address converting circuit for generating data X and Y for specifying X and Y addresses and data P for specifying the input/output bit of the failure analysis memory based on the increment addresses; and a selector for selecting the specified data by the data P among the readout data from the corresponding storage region of the failure analysis memory to the specified X and Y addresses by the data X and Y.

According to the present invention, one advantage is that logical image data can be easily converted into physical image data without a conversion memory when the failure analysis of a memory device is carried out. Therefore, since a fail can be easily read out from the failure analysis memory, the failure analysis can be rapidly carried out.

BRIEF EXPLANATION OF THE DRAWINGS

FIG. 2A shows an example of output bit data A0 through A4 from a counter 1.

FIG. 2B shows an example of output bit data S0 through S4 from a selector 2.

FIG. 2C shows an example of output bit data R0 through R4 from a register 3.

FIG. 3A shows an example of output bit data N0 through N4 from an EOR gate 4.

FIG. 3B shows an example of output bit data D0 through D4 from an EOR gate 5.

FIG. 3C shows an example of output data X,Y, and P from a selector 6.

FIG. 9 shows an example of data stored in a conversion memory 10.

DETAILED DESCRIPTION OF THE PREFERRED EMBODIMENT

Figure 1:
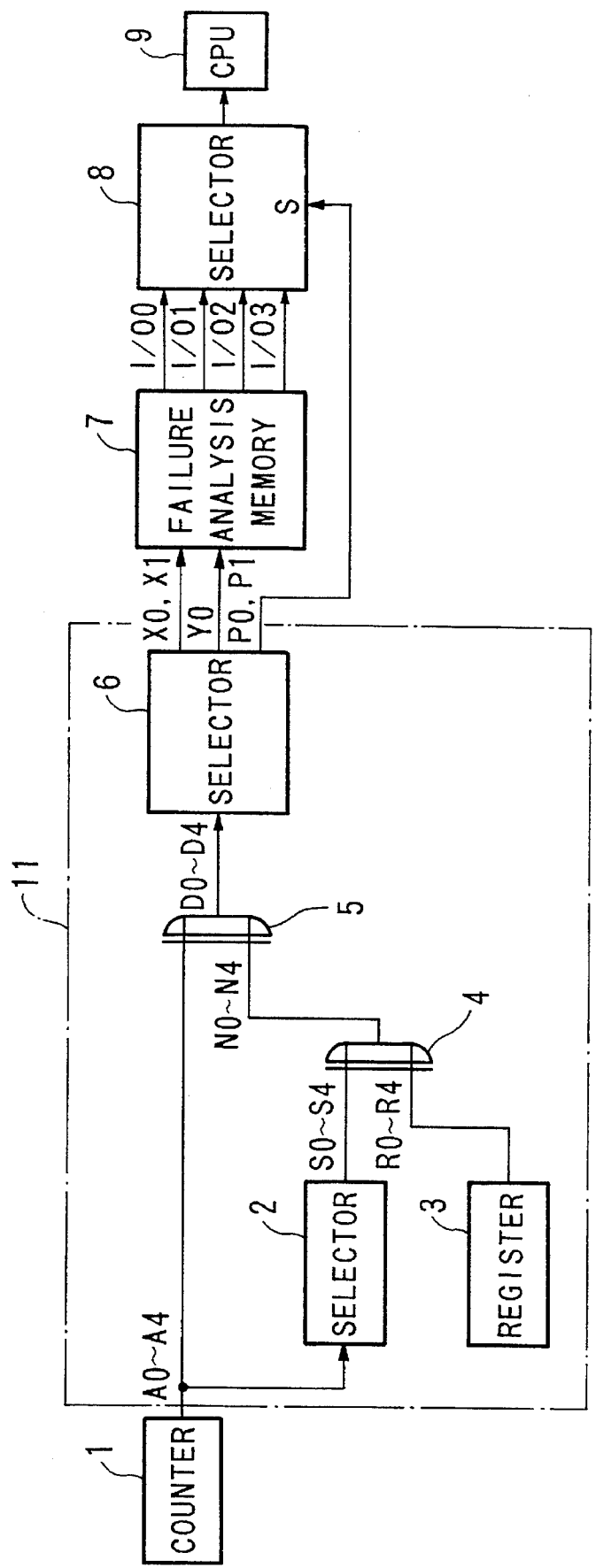
FIG. 1 shows a block diagram of the structure of a physical image converting circuit based on the preferred embodiment of the present invention.
Figure 4:
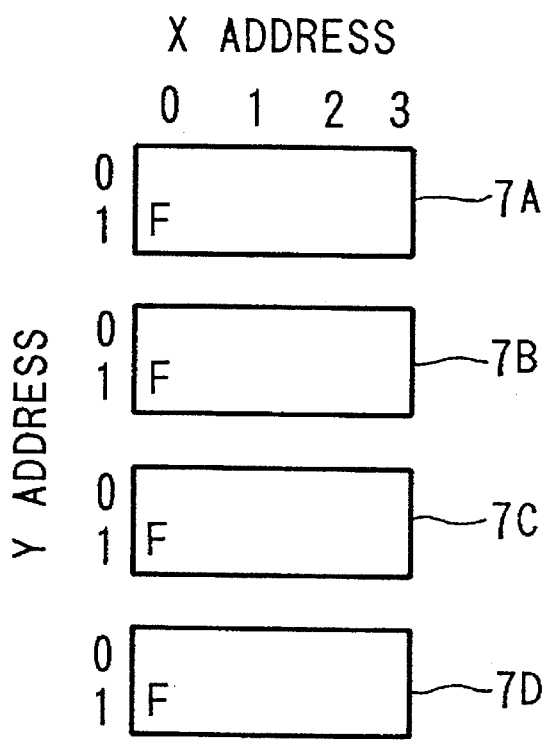
FIG. 4 shows an example of the structure of failure analysis memories 7A through 7D.
Figure 5:
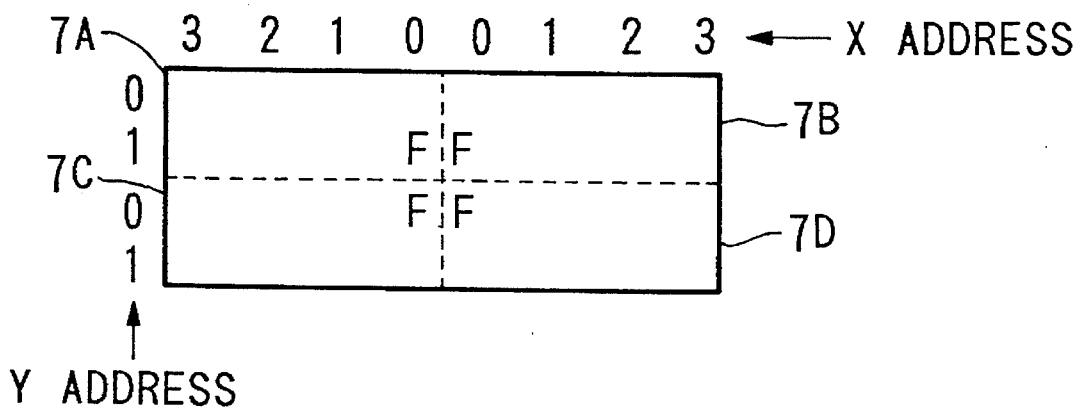
FIG. 5 shows the physical alignment of failure analysis memories 7A through 7D in a wafer chip and a physical position on a wafer chip of fails stored in failure analysis memories 7A through 7D.
Figure 6:
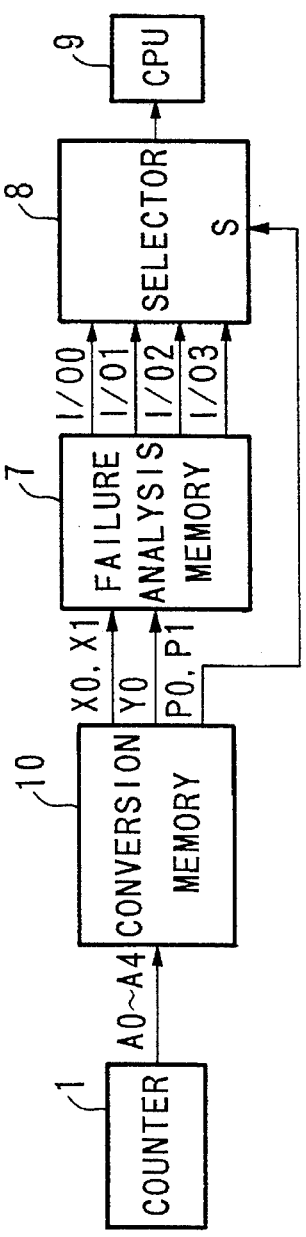
FIG. 6 shows a block diagram of the structure of the conventional physical image converting circuit.

Hereinafter, a preferred embodiment of the present invention will be explained with reference to FIG. 1. FIG. 1 shows a block diagram of the structure of a physical image converting circuit based on the preferred embodiment of the present invention in the case where the failure analysis memory 7 has the physical alignment of memory cells shown in FIG. 7. In FIG. 1, components which correspond to components in the conventional physical image converting circuit shown in FIG. 6 are given the same identifying numerals.

In FIG. 1, an address converting circuit 11 includes selectors 2 and 6, a register 3, and exclusive OR gates (hereafter referred to as EOR gates) 4 and 5. In FIG. 1, the counted value of the counter 1 is supplied to the selector 2 and a first input terminal of the EOR gate 5 as the address represented by the bit data A0 through A4. The selector 2 selects arbitrary bit data among the bit data A0 through A4 supplied from the counter 1 and supplies output bit data S0 through S4 including the selected bit data to a first input terminal of the EOR gate 4. The register 3 supplies the prestored bit data R0 through R4 to a second input terminal of the EOR gate 4. The EOR gate 4 carries out exclusive OR operation for the bit data S0 through S4 and the bit data R0 through R4 and supplies the resultant bit data N0 through N4 to a second input terminal of the EOR gate 5. The EOR gate 5 carries out exclusive OR operation for the bit data A0 through A4 and the bit data N0 through N4 and supplies the resultant bit data D0 through D4 to the selector 6.

Figure 7:
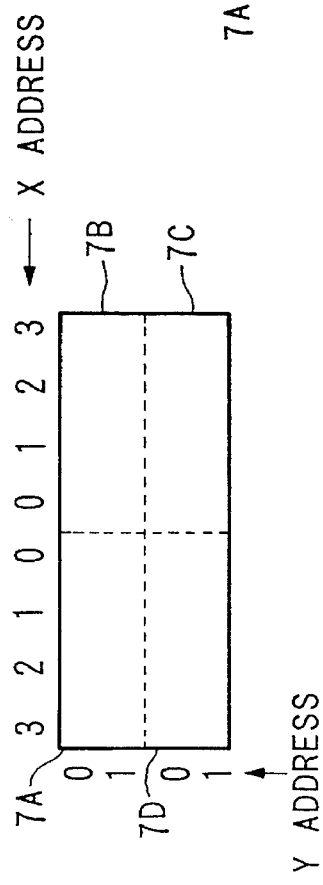
FIG. 7 shows the physical alignment of memory cells in a failure analysis memory 7 in the case where failure analysis memory 7 is made up of four failure analysis memories 7A through 7D.

In the case where the failure analysis memory 7 has the physical alignment of the memory cells shown in FIG. 7, the relationship between the 5-bit data A0 through A4 consisting of the counted value of the counter 1, the bit data X0 and X1 consisting of the X address, the bit data Y0 consisting of the Y address, and the bit data (P0, P1), are represented by formulas (1) through (5).

$$X0 = A0 \oplus \overline{A2} \quad (1)$$

$$X1 = A1 \oplus \overline{A2} \quad (2)$$

$$Y0 = A3 \oplus \quad (3)$$

$$P0 = A2 \quad (4)$$

$$P1 = A4 \quad (5)$$

As can be seen from the formulas (1) and (2), each of the bit data (X0, X1) forming the X address of each of the failure analysis memories 7A through 7D of the failure analysis memory 7 is represented by each of the exclusive OR operated results for the bit data (A0, A1) and the inverted bit data/(A2), respectively. As can be seen from the formula (3), the Y address of each of the failure analysis memories 7A through 7D of the failure analysis memory 7 is represented by the bit data A3. Since, as can be seen from the formulas (4) through (5), each of the bit data (P0, P1) is represented by each of the bit data (A2, A4) from the counter 1, and those are used for determining any I/O bit data among the I/O bit data I/O0 through I/O3, in the same manner as in the conventional art, the I/O bit data I/O0 through I/O3 of the failure analysis memory 7 are represented using the bit data (A2, A4). The arbitrary bit data among the bit data A0 through A4 from the counter 1, is selected by the selector 2 based on the formulas (1) through (5). The data are pre-stored in the register 3 based on the formulas (1) through (5).

Next, the operation of the physical image converting circuit of the present invention shown in FIG. 1 will be explained with reference to FIGS. 2 and 3. FIG. 2A shows an example of the output bit data A0 through A4 from the counter 1. The bit data A0 through A4 form 5-bit increment addresses. FIG. 2B shows an example of the output bit data S0 through S4 from the selector 2. The bit data A2 among the 5-bit data A0 through A4 from the counter 1 are selected and the selected bit data A2 is stored as both of the bit data (S0, S1) among the 5-bit data S0 through S4 in the required storage region of the selector 2. FIG. 2C shows an example of the output bit data R0 through R4 from the register 3. A "1" is stored in each of the storage regions corresponding to the bit data (R0, R1) among the 5-bit data R0 through R4 of the register 3.

Figure 8:
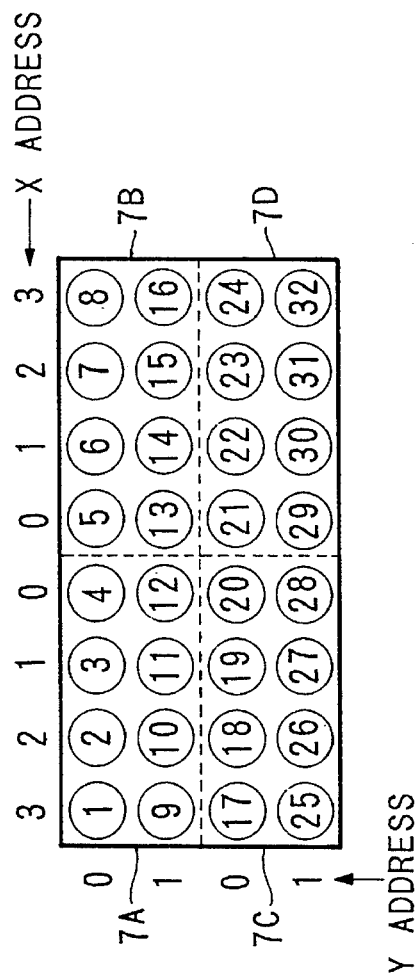
FIG. 8 shows the numbered memory cells of a failure analysis memory 7 in the case of the physical alignment of memory cells shown in FIG. 7.

FIG. 3A shows an example of the output bit data N0 through N4 from the EOR gate 4. In the EOR gate 4, the exclusive OR operation is carried out for the output bit data S0 through S4 (see FIG. 2B) from the selector 2 and the output bit data R0 through R4 (FIG. 2C) from the register 3 and the resultant bit data are stored as the 5-bit data N0 through N4 in the required region of the EOR gate 4 as shown in FIG. 3A. FIG. 3B shows an example of the output bit data D0 through D4 from the EOR gate 5. In the EOR gate 5, the exclusive OR operation is carried out for the output bit data A0 through A4 (see FIG. 2A) from the counter 1 and the output bit data N0 through N4 (see FIG. 3A) from the EOR gate 4 and the resultant bit data are stored as the 5-bit data D0 through D4 in the required region of the EOR gate 5 as shown in FIG. 3B. In FIG. 3B, each of the bit data D0 through D4 correspond to each of the bit data X0, X1, P0, Y0, and P1. Each of the memory cells in the failure analysis memory 7 shown in FIG. 8 can be determined by the bit data D0 through D4. FIG. 3C shows an example of the output data X, Y, and P from the selector 6. Each of the data X and Y is used for designating the corresponding X and Y address of the failure analysis memory 7 to the data to be read. The data P is use for designating the I/O bit of the failure analysis memory 7.

In FIG. 1, the data X and Y among the output data from the selector 6 are supplied to the failure analysis memory 7 to read out the I/O bit data from each of the failure analysis memories 7A through 7D forming the failure analysis memory 7 and to supply the readout data to the selector 8. In the selector 8, any one of I/O bit output data I/O0 through I/O3 supplied from the failure analysis memory 7 based on the data P0 and P1 from the selector 6, is selected, and the selected data is supplied to the CPU 9 in the same manner as in the conventional art. Accordingly, the data stored as the logical image in the failure analysis memory 7 are sequentially expanded and are converted into a physical image.

What is claimed is:

1. A failure analysis device which determines position of defective memory cells among memory cells forming a memory device under analysis according to physical positions on a wafer chip on which said memory cells are formed, said failure analysis device comprising:

a failure analysis memory having a storage capacity and having memory areas specifying data storage positions, for storing two-dimensional addresses represented by X and Y addresses corresponding to each bit of digital data read from said memory device under analysis;

a counter for generating increment addresses as bit data corresponding to at least said storage capacity of said failure analysis memory;

a first selector for selecting arbitrary bit data from said bit data forming said increment addresses output from said counter based on a logical formula for converting said increment addresses into data representing said physical positions on said wafer chip;

a register for pre-storing data based on said logical formula;

a first exclusive OR gate for carrying out exclusive OR operations on data output from said first selector and from said register;

a second exclusive OR gate for carrying out exclusive OR operations on said increment addresses output from said counter and data output from said first exclusive OR gate;

a second selector for generating X and Y data, output to said failure analysis memory, said X and Y data representing said X and Y addresses of each of said memory areas of said failure analysis memory, and for generating P data designating a single I/O bit among I/O data stored at said addresses respectively specified by said X and Y data;

a third selector for selecting I/O output data based on the P data output from said second selector; and an expansion processor for expanding the I/O output data selected by said third selector onto positions corresponding to said physical positions of said memory cells on said wafer chip.

* * * * *